US008190350B2

(12) United States Patent
Kortschak et al.

(10) Patent No.: US 8,190,350 B2
(45) Date of Patent: May 29, 2012

(54) MICRO-HYBRID MOTOR VEHICLE

(75) Inventors: Bernhard Kortschak, Deutschlandsberg (AT); Birger Fricke, Aachen (DE); Alan Walker, London (GB); Bo Gao, Brentwood (GB)

(73) Assignee: Ford Global Technologies, LLC, Dearborn, MI (US)

( * ) Notice: Subject to any disclaimer, the term of this patent is extended or adjusted under 35 U.S.C. 154(b) by 923 days.

(21) Appl. No.: 12/173,305

(22) Filed: Jul. 15, 2008

(65) Prior Publication Data
US 2009/0024265 A1   Jan. 22, 2009

(30) Foreign Application Priority Data

Jul. 19, 2007  (GB) .................................. 0714050.2

(51) Int. Cl.
*G06F 19/00* (2011.01)

(52) U.S. Cl. ........................................ 701/113; 701/105

(58) Field of Classification Search .................. 701/22, 701/105, 113
See application file for complete search history.

(56) References Cited

U.S. PATENT DOCUMENTS

| 5,285,862 | A  | * | 2/1994  | Furutani et al. .......... 180/65.245 |
| 6,268,712 | B1 | * | 7/2001  | Laig-Horstebrock et al. ............................. 320/132 |
| 6,414,453 | B1 |   | 7/2002  | Tamagawa et al. |
| 6,501,250 | B2 | * | 12/2002 | Bito et al. ..................... 320/152 |
| 6,742,487 | B2 | * | 6/2004  | Yamaguchi et al. ........ 123/179.3 |
| 6,769,389 | B2 | * | 8/2004  | Tamai et al. ................ 123/179.3 |
| 6,904,342 | B2 | * | 6/2005  | Hanada et al. ................... 701/22 |
| 7,021,255 | B2 | * | 4/2006  | Degner et al. ............. 123/90.11 |
| 7,267,090 | B2 | * | 9/2007  | Tamai et al. ................ 123/179.3 |
| 7,336,002 | B2 | * | 2/2008  | Kato et al. .................... 307/10.6 |
| 7,652,448 | B2 | * | 1/2010  | Palladino ..................... 320/104 |
| 7,821,214 | B2 | * | 10/2010 | Yaguchi ..................... 318/400.09 |

FOREIGN PATENT DOCUMENTS
WO   WO 2007/037972   4/2007

* cited by examiner

*Primary Examiner* — Hussein A. Elchanti
(74) *Attorney, Agent, or Firm* — David B. Kelley; MacMillian, Sobanski & Todd, LLC

(57) ABSTRACT

A micro-hybrid motor vehicle 2 having an engine 5 started by an electrical starter 6 is disclosed having a starter system that adaptively responds to ageing of an electrical power source such as a capacitor 12 used to power the starter motor 6 so as to maintain engine starting performance. The starter system includes a controller 20 which is programmed to increase the voltage used to charge the capacitor 12 when it is determined that the state of health of the capacitor 12 has degraded.

23 Claims, 13 Drawing Sheets

MICRO-HYBRID MOTOR VEHICLE

This invention relates to micro-hybrid motor vehicles and in particular to a stop-start system for starting a micro-hybrid motor vehicle during stop-start operation in which capacitor degradation monitoring is used to adapt the stop-start system.

It is well known to provide a motor vehicle fitted with a conventional internal combustion engine with a system to automatically stop the engine of the motor vehicle when certain predetermined conditions are met in order to increase fuel economy and reduce pollution. Such a motor vehicle is often referred to as a micro-hybrid motor vehicle or micro-hybrid vehicle.

It is a problem with such a micro-hybrid vehicle that a considerable amount of electrical energy is required to restart the internal combustion. Additionally, the electrical energy should support the 12V power net when the engine is stopped. If the frequency of stop-start cycles is high, a very high capacity battery is required in order to provide sufficient energy due to the relatively long period of time required to recharge a conventional electrochemical battery. Such high capacity batteries are both heavy and bulky to package.

It has therefore been proposed to replace the conventional electrochemical battery with an ultracapacitor or supercapacitor. Such devices have the advantage that they can rapidly be recharged. Therefore, even if the frequency of stop-start cycles is high, a supercapacitor can normally be recharged to substantially its full capacity. This permits the use of a supercapacitor with less capacity than an electrochemical battery which compensates for the lower energy density of a supercapacitor compared to an electrochemical battery.

It is however a problem with such supercapacitors that over time their capacity reduces and their internal resistance increases due to ageing effects. In order to ensure reliable starting performance, it has thus far been necessary to either:—
(i) use a supercapacitor having more capacity when new than is actually required so as to allow for the effect of ageing, which has the disadvantage that such a supercapacitor is larger and bulkier than is really required to start the engine, or
(ii) tolerate deterioration in start performance with age.

It is an object of this invention to provide a motor vehicle with a system for starting the engine during stop-start operation that monitors supercapacitor ageing and can compensate for it.

According to a first aspect of the invention, there is provided a micro-hybrid motor vehicle having an internal combustion engine and an engine starter system for starting the engine wherein the engine starter system comprises an electrical starter to start the engine, a capacitor to supply electrical energy to the starter to start the engine, a generator to supply electrical energy to the capacitor to recharge the capacitor and a controller to adjust starter system parameters wherein the controller is operable to adjust starter system parameters based upon monitored capacitor degradation.

Adjusting starter system parameters may comprise adjusting the voltage to which the capacitor is charged.

The voltage may be adjusted based upon a comparison of a start duration with a predicted start duration.

The system may further comprise a voltage sensor to measure the voltage of the capacitor and the controller uses the measured voltage to calculate the predicted start duration.

The predicted start duration may be determined using a look up table relating time to reach the predetermined cranking speed and voltage.

The system may further comprise a voltage sensor to measure the voltage of the capacitor, a temperature sensor to measure the temperature of the capacitor and the controller uses the measured voltage and the measured temperature to calculate the predicted start duration.

The predicted start duration may be determined using a three dimensional look up table relating expected start duration, temperature and voltage.

The voltage may be increased by a predetermined amount if the measured start duration is greater than the expected start duration.

The voltage may be decreased by a predetermined amount if the measured start duration is less than the expected start duration.

The engine starter and the generator may be formed as a single integrated starter-generator.

The integrated starter-generator is a multi-phase device and micro-hybrid motor vehicle further comprises an inverter having a DC side connected to the capacitor and a multi-phase side connected to the integrated starter-generator wherein the controller is operable to adjust the starter system parameters by adjusting the DC voltage supplied to the capacitor from the inverter to recharge the capacitor.

Adjusting starter system parameters may comprise adjusting at least one starter system parameter based upon a determination of an estimate of capacitor degradation obtained from a measurement of maximum voltage drop during cranking of the engine.

Adjusting starter system parameters may comprise adjusting at least one starter system parameter based upon a determination of the voltage drop in a DC cable connecting the capacitor to the starter motor.

Adjusting starter system parameters may comprise adjusting at least one starter system parameter based upon a measured capacitor current.

Adjusting starter system parameters may comprise adjusting at least one starter system parameter based upon a determination of losses from a voltage curve generated from measurements taken during cranking of the engine.

Adjusting starter system parameters may comprise adjusting at least one starter system parameter based upon a determination of a time constant produced from voltage measurements taken during cranking of the engine.

Adjusting starter system parameters may comprise adjusting at least one starter system parameter based upon a determination of a prediction of capacitor ageing.

Adjusting starter system parameters may comprise adjusting at least one starter system parameter based upon an estimate of capacitor capacitance obtained using a voltage slope generated from measurements taken during cranking of the engine.

The capacitor may be a supercapacitor pack having a number of supercapacitors joined together in series.

According to a second aspect of the invention, there is provided a method of controlling operation of an internal combustion engine starter system using a capacitor as an electrical energy source for starting the internal combustion engine the method comprising monitoring capacitor performance during starting of the engine and adjusting one or more starter system parameters to compensate for capacitor degradation.

Adjusting one or more starter system parameters may comprise adjusting a voltage supplied to the capacitor to recharge it.

The method may further comprise measuring the start duration, predicting a start duration from one or more measured parameters, comparing the measured start duration with the predicted start duration and adjusting the voltage supplied to the capacitor to recharge it based upon the comparison.

The method may further comprise measuring a voltage of the capacitor prior to starting and the predicted start duration is based upon the measured voltage.

The method may further comprise measuring a voltage of the capacitor prior to starting, measuring the temperature of the capacitor prior to starting and the predicted start duration is based upon the measured voltage and the measured temperature.

The method may further comprise increasing the voltage supplied to the capacitor to increase its charge if the measured start duration is greater than the predicted start duration.

The method may further comprise decreasing the voltage supplied to the capacitor to reduce its charge if the measured start duration is less than the predicted start duration.

The method may further comprise determining an indication of capacitor degradation from the monitored capacitor performance during starting of the engine, using the indicator to produce a variable indicative of a required charging voltage correction and adjusting one or more starter system parameters by adjusting the charging voltage based upon the variable to compensate for capacitor degradation.

The invention will now be described by way of example with reference to the accompanying drawing of which:—

Figure 1:
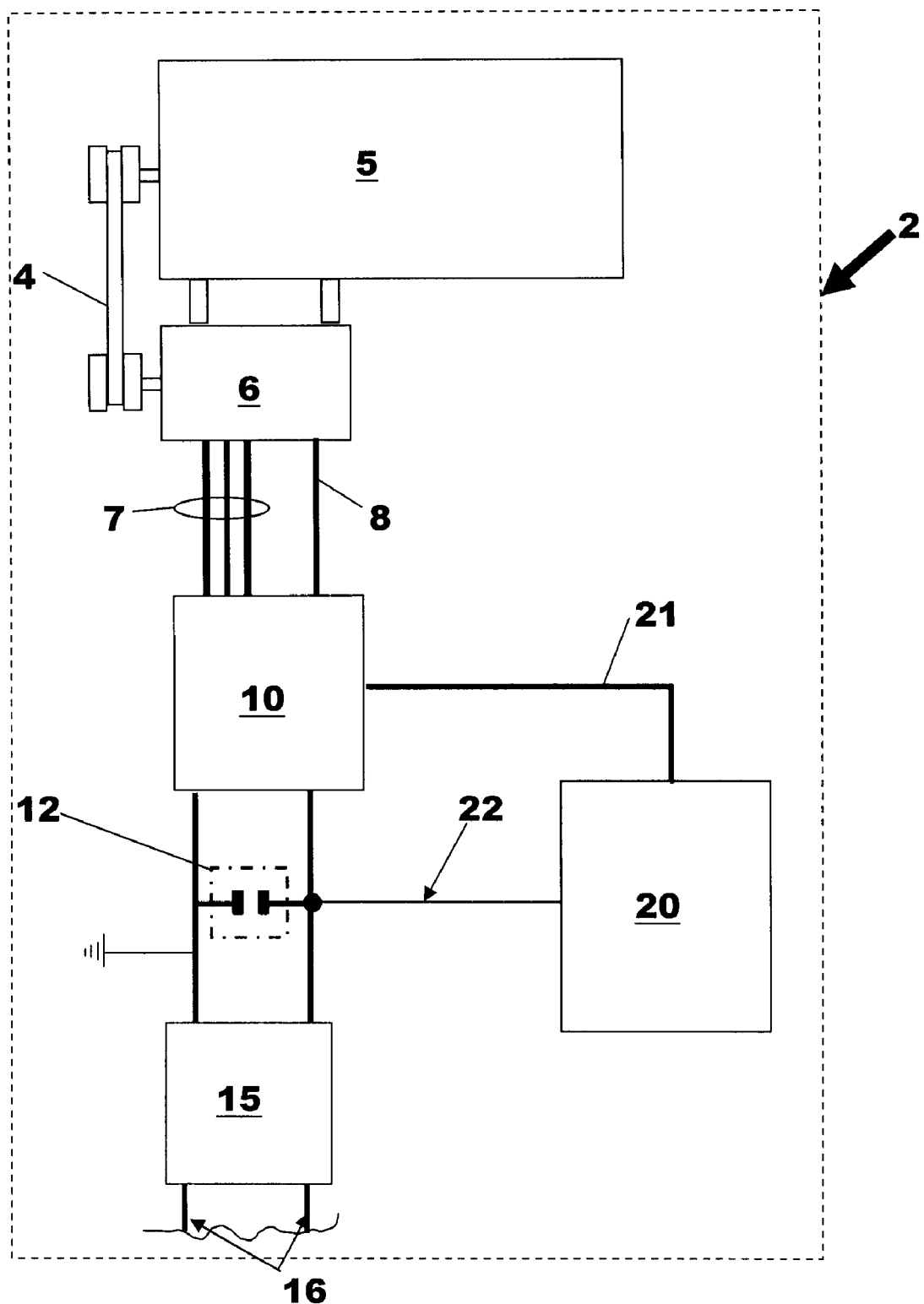
FIG. 1 is a diagrammatic representation of a micro-hybrid vehicle according to one embodiment of the invention.

With reference to FIG. 1 there is shown a micro-hybrid vehicle 2 having an internal combustion engine 5 to provide tractive effort for the micro-hybrid vehicle 2 via a transmission (not shown). An integrated starter-generator 6 is driveably connected to one end of a crankshaft (not shown) of the engine 5 by means of a drive belt 4. It will be appreciated that other means of driveably connecting the integrated starter-generator 6 to the engine 5 could be used and that the invention is not limited to use with a belt drive. Furthermore, it will be appreciated that the invention is also applicable to a micro-hybrid vehicle having a separate starter motor and generator.

In this case, the integrated starter-generator 6 is a multi-phase alternating current device and is connected via a multi-phase cable 7 to an inverter 10. A control lead 8 is used to transfer data bi-directionally between the integrated starter-generator 6 and the inverter 10 and supplies in this case a signal indicative of the rotational speed of the integrated starter-generator which can be used to calculate the rotational speed of the engine 5. Alternatively, the engine speed could be measured directly using a crankshaft sensor or another sensing device.

A supercapacitor pack 12 is connected to the direct current side of the inverter 10. The supercapacitor pack in this case contains ten 2.7 volt supercapacitors (electric double-layer capacitors sometimes referred to as cells) and so has a nominal terminal voltage of 27 volts. It will be appreciated that more or less supercapacitors could be used in the supercapacitor pack and that the voltage of each of the supercapacitors forming the pack could be more than or less than 2.7 volts.

The supercapacitor pack 12 is also connected to a DC/DC voltage converter 15. The DC/DC converter is connected to a 12 volt supply (not shown) by means of supply leads 16. The 12 volt supply includes a conventional electrochemical battery (not shown) and is used to power electrical devices mounted on the micro-hybrid vehicle 2 as is well known in the art. The integrated starter-generator 6 is also operable to recharge the supercapacitor and electrochemical battery but the means and electrical connections required to perform this function are not shown or described herein. The DC/DC converter is also used to recharge the supercapacitor pack 12 from the 12 volt supply if the micro-hybrid vehicle 2 has not been operated for several weeks and the charge in the supercapacitor pack 12 has leaked away below a predetermined level required for successful starting. The DC/DC converter provides a voltage of more than 12 volts for performing this recharging function. Alternatively, a conventional starter, which is connected to the 12V supply, could be used. This function is not shown or described herein.

A supercapacitor controller 20 is operatively connected to the inverter 10 by a control line 21 to control the flow of electricity between the inverter 10 and the supercapacitor pack 12. The supercapacitor controller 20 continuously receives through a voltage sensor line 22 a signal from the supercapacitor pack 12 indicative of the terminal voltage of the supercapacitor pack 12 and a signal via the control line 21 indicative of engine speed. It will be appreciated that the supercapacitor controller 20 could be formed as part of the inverter 10 or another electrical controller such as a powertrain controller and that the invention is not limited to the use of a separate supercapacitor controller.

The supercapacitor controller 20 is programmed to monitor supercapacitor degradation due to ageing and to adjust one or more starter system parameters based upon the assessment of degradation. That is to say, the supercapacitor controller 20 determines the state of health of the supercapacitor pack 12 and adjusts the operation of the inverter 10 to maintain consistent starting performance.

The system parameters, which are considered in this invention, are the voltage limits of the supercapacitor voltage. These voltage limits restrict the usage of the supercapacitor pack to a safe operating area. The capacitor voltage level can be freely adjusted within this safe operating area by the operating mode of the power inverter and/or by the operating mode of the DCDC converter. For simplification of the description within this invention, the supercapacitor is simplified by a resistance-capacitance model (see FIG. 10), whereas Rscap and Cscap correspond to the resistance and capacitance value, respectively. This model can also include cable resistance indicated by Rcable as illustrated in FIG. 11. As such, the invention can be applied to monitor cable and connector resistance values as well.

The degradation of the supercapacitor can then be described by an increasing resistance and/or and decreasing capacitance. It is well known that the resistance and capacitance of the supercapitor can change with temperature as well, but two-dimensional maps can easily compensate this effect as it is shown below.

Figure 12:
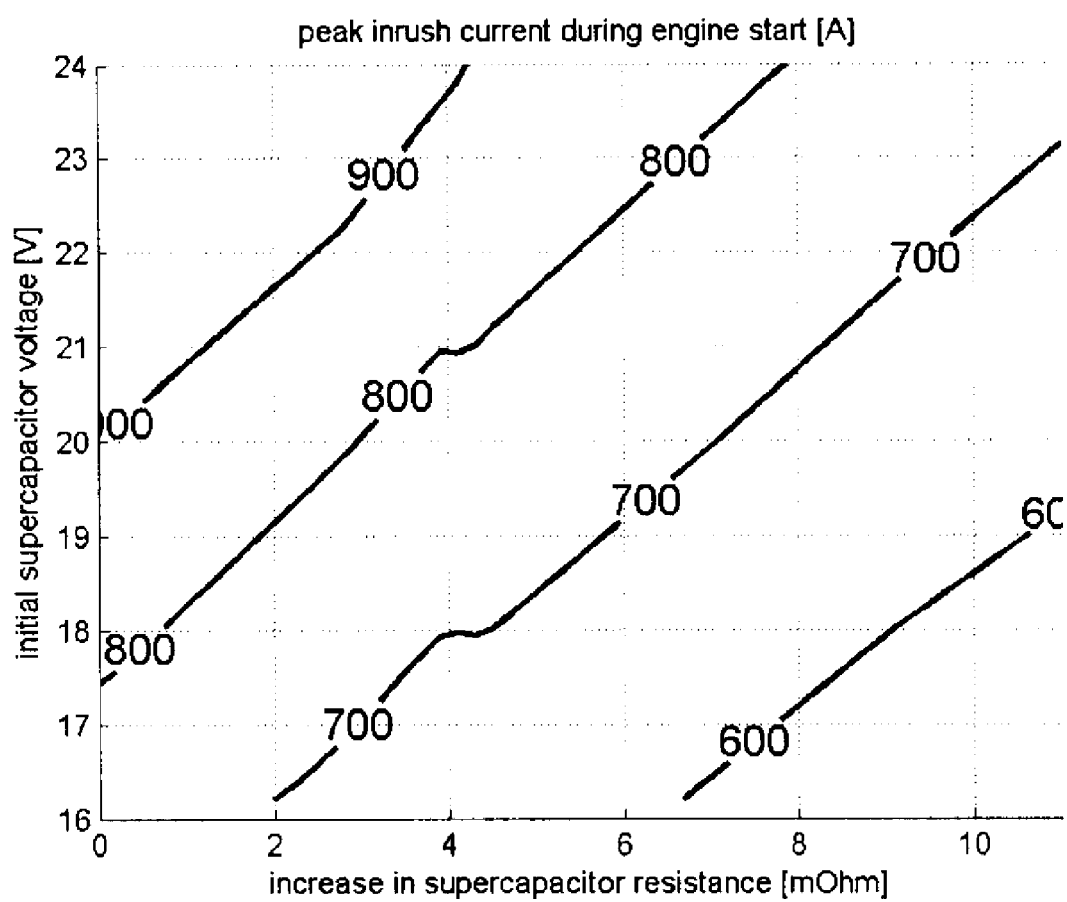
FIG. 12 is a chart showing the peak inrush current during start as a function of supercapacitor voltage and additional capacitor resistance.

The voltage level of the pack and its resistance and capacitance values influence the behaviour of the whole system. For instance, FIG. 12 illustrates that the peak inrush current during an engine start depend on voltage and resistance value. To protect the supercapacitor and/or other system components like the power inverter, it could be mandatory to operate below a certain current limit. As such a system parameter specifies an upper voltage limit of the supercapacitor package according to its increasing resistance value. Another example is presented in FIG. 13. For an engine start, the time to start is a function of resistance and voltage level. According to this relationship, another system parameter is adjusted to ensure an appropriate start performance. FIG. 14 illustrates that the available energy is a function of voltage and capacitance degradation. A system parameter can take this into account such that, for instance, a specified reserve of energy is available. These examples show that one or more system parameters need to be adjusted according to the degradation of the supercapacitor.

The following paragraphs present a method to measure the mentioned degradation and a way to adjust the system parameter accordingly.

Figure 4:
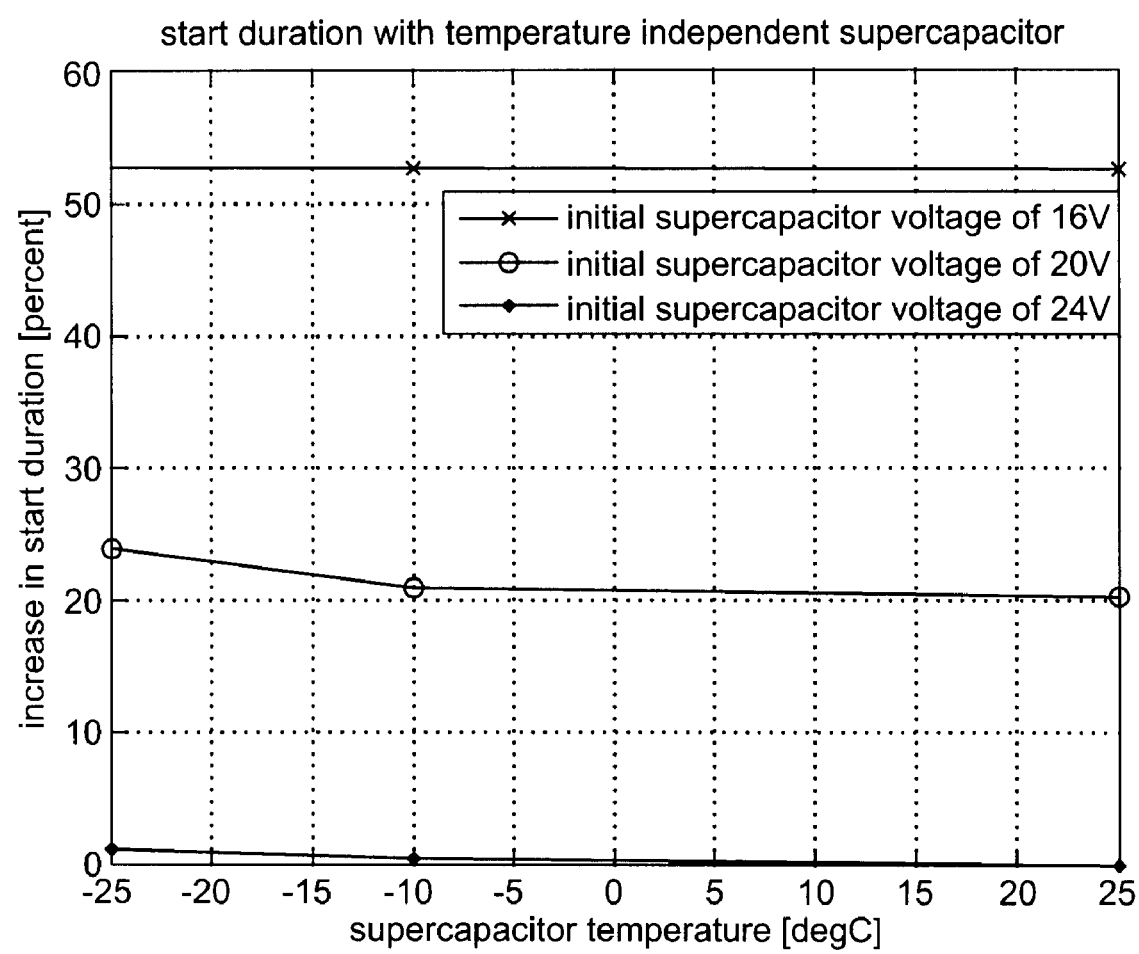
FIG. 4 is a chart showing the relationship between the time taken to start an engine versus temperature for an almost temperature independent type of supercapacitor from different initial voltages.

In the embodiment shown in FIG. 1, the supercapacitor pack 12 comprises of ten temperature independent supercapacitors each of 2.7 volts connected together in series to provide a nominal output voltage of 27 volts. A temperature independent supercapacitor is one in which the electrical characteristics of capacity and resistance are virtually constant for the normal temperature operating range of the micro-hybrid vehicle 2 which in the case is minus 25 degrees Celsius to plus 25 degrees Celsius and above. The increasing engine starting time of a temperature independent supercapacitor pack having differing initial voltages and temperatures is shown in FIG. 4 as plots 16V, 20V and 24V. The results shown are for Maxwell Boostcap™ type devices manufactured by General Atomics Electronic Systems Inc. and have initial terminal voltages of 16, 20 and 24 volts respectively.

It can be seen from FIG. 4 that the time to start for all three of these initial voltages is substantially constant throughout the desired temperature range and that the time to start is related to voltage.

Therefore, by using a lookup table stored in a memory of the supercapacitor controller 20, it is possible to predict the time that should be taken to reach the predetermined cranking speed from a measurement of the voltage at an output terminal of the supercapacitor pack 12, in the new condition.

The supercapacitor controller 20 is therefore operable to use the voltage supplied through the voltage sensor line 22 to determine a predicted time to start and compare this with a actually measured time by starting an internal timer when starting commences and stopping the internal timer when the starting is complete and then reading the value from the internal timer. If this comparison indicates that the measured time is greater than the predicted time, it indicates a loss of performance (or ageing) from the supercapacitor pack 12 and, in order to compensate for this loss of performance, the supercapacitor controller 20 is operable to increase the voltage supplied by the inverter 10 to the supercapacitor pack 12 at the next recharge so as to compensate for this loss in performance. If for any reason the measured time is less than the predicted time, it indicates an overcharging of the supercapacitor pack 12 and in order to compensate for this the supercapacitor controller 20 is operable to decrease the voltage supplied by the inverter 10 to the supercapacitor pack 12 at the next recharge. The measurement and comparison may be made for several starts and an average taken before the voltage supplied by the inverter is altered. It will be appreciated that the increase in charge voltage may be different to the predetermined decrease in charge voltage.

During use of the micro-hybrid vehicle 2, the integrated starter-generator 6 is used to recharge the supercapacitor pack 12.

When the engine 5 is to be restarted, the inverter 10 is operable to convert the DC supply from the supercapacitor pack 12 into a multi-phase alternating current supply to operate the integrated starter-generator 6 as a motor to crank the engine 5 up to a desired cranking speed required for engine starting.

Such a system using a temperature independent supercapacitor has the advantage that only a two dimensional look up table or linear relationship is required to determine the predicted starting time. Because any loss in supercapacitor pack performance is compensated for by increasing the charge voltage, there is no need to use a supercapacitor pack sized for end of life performance and so a smaller and lighter supercapacitor pack can be used.

Figure 3:
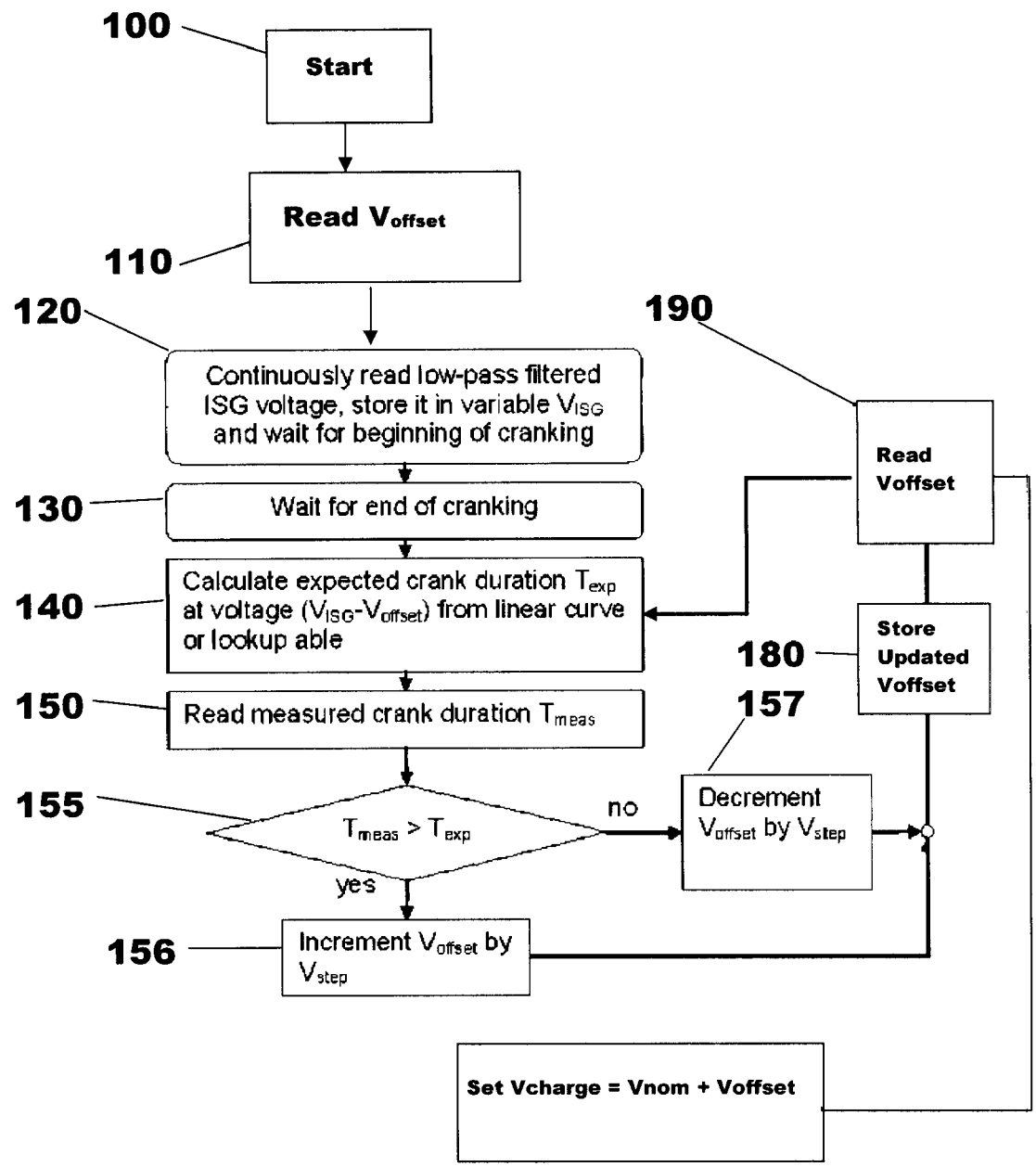
FIG. 3 is a flow chart showing a method according to the invention.

With reference to FIG. 3, there is shown a method of compensating for supercapacitor ageing of the type embedded as executable instructions in the supercapacitor controller 20 shown in FIG. 1.

The method starts at step 100, which would typically be a key-on event for the micro-hybrid vehicle 2.

Then at step 110 a voltage offset $V_{offset}$ used to compensate for degradation, is read from the non-volatile memory of the power-inverter.

At step 120, the terminal voltage of the supercapacitor pack 12 is continuously monitored and repetitively stored as a variable $V_{ISG}$ in a memory device. When cranking of the engine is started, a timer forming a sub-step of step 120 is started and this timer is allowed to run until starting is complete (that is to say until the energisation of the integrated starter-generator 6 is terminated). At step 130, the measured time taken to reach the predetermined speed is stored in a memory device as variable $T_{meas}$.

Then, at step 140, an expected cranking duration $T_{exp}$ is determined for a voltage corresponding to the measured voltage $V_{ISG}$ at commencement of cranking minus the voltage offset $V_{offset}$ using a look up table or a linear graph of voltage versus time.

At step 150, the previously stored value of measure time $T_{meas}$ is compared to the predicted or expected cranking duration $T_{exp}$. If $T_{meas}$ is greater than $T_{exp}$ then this indicates that there has been a reduction in starting performance and so the method advances to step 156, but if $T_{meas}$ is less than $T_{exp}$, then this indicates that the starting performance is better than expected and the method advances to step 157.

At step 156, the voltage offset $V_{offset}$ is adjusted up by a predetermined amount $V_{step}$ which can be in the order of 10 mV. Alternatively at step 157 the voltage offset $V_{offset}$ is adjusted down by a predetermined amount $V_{step}$ which can be the same amount as used in step 156 or can be a different amount.

Then, after either of steps 156 and 157, the method advances to step 180 where the new voltage offset $V_{offset}$ is stored in memory. The method then advances to step 190 where the newly updated voltage offset $V_{offset}$ is read for use in the next calculation cycle and is also read for use in step 200 for calculating the charge voltage $V_{charge}$ to be used by the inverter 10 the next time the supercapacitor pack 12 is charged using the equation $V_{charge}=V_{nom}+V_{offset}$.

Where:—$V_{nom}$ is the nominal charge voltage of the supercapacitor pack when new and $V_{offset}$ is the correction factor as determined by the method in steps 120 to 157.

Therefore, if the start duration is longer than that predicted from the measured voltage, the voltage used by the inverter 10 when the supercapacitor pack 12 is charged will be incremented up by the value $V_{step}$. When the supercapacitor pack 12 is used for the first time $V_{offset}$ can be preset to zero for the first iteration.

One of the advantages of this approach is that if there is a deterioration in one of the power connections between the supercapacitor pack 12 and the integrated starter-generator 6 or in the transfer efficiency of the inverter 10, then these are automatically compensated for by the variable $V_{offset}$.

Figure 2:
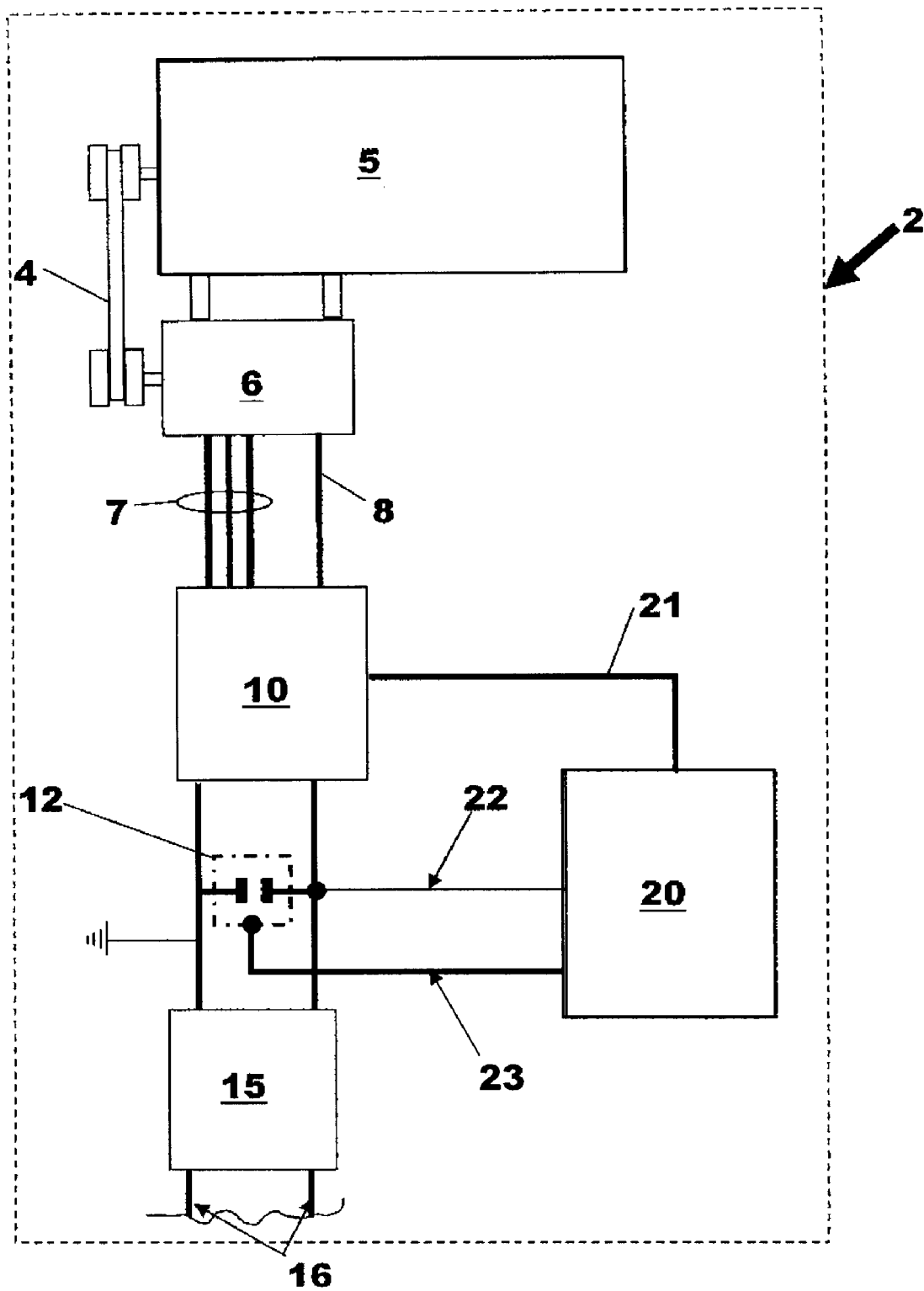
FIG. 2 is a diagrammatic representation of a micro-hybrid vehicle according to an alternative embodiment of the invention.

Referring now to FIG. 2, there is shown a motor vehicle 2 which in most respects is identical to that previously described with reference to FIGS. 1 and 3, the only significant difference is that the supercapacitor pack 12 utilises supercapacitors that are variable with respect to temperature that is to say they are temperature sensitive.

Figure 15:
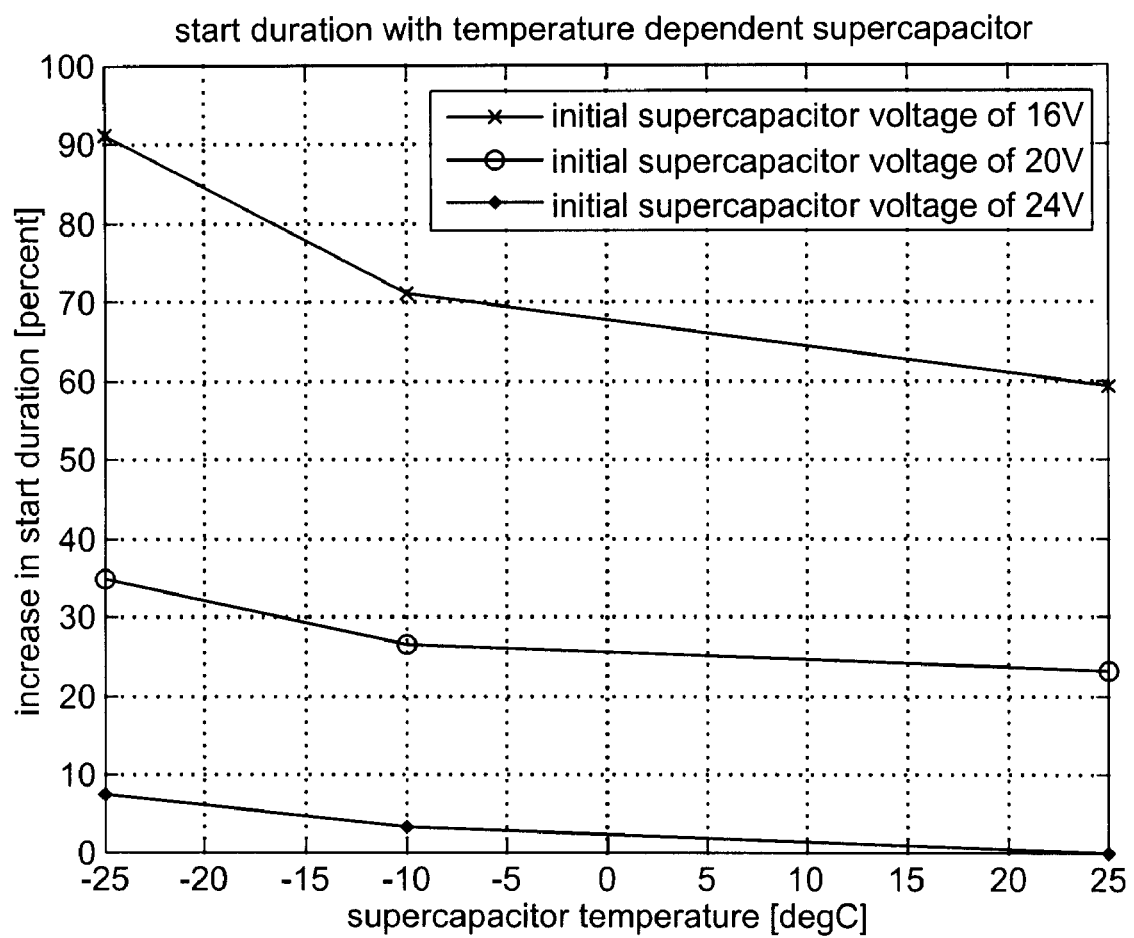
FIG. 15 is a chart showing the relationship between the time taken to start an engine versus temperature for an temperature dependent type of supercapacitor from different initial voltages.

FIG. 15 shows the effect of temperature between 25 degrees Celsius and minus 25 degrees Celsius for a temperature sensitive supercapacitors at 16V, 20V and 24V initial voltage. It can be seen that as the temperature is reduced the starting time increases.

In order to overcome these temperature effects, the micro-hybrid vehicle 2 shown in FIG. 2 includes a temperature sensor embedded in the supercapacitor pack 12 connected to the supercapacitor controller 20 by a temperature sensor line 23 or any other means of obtaining temperature information of the supercap, such as a temperature model of the supercap.

Operation of the system is much as before but in this case, when it is necessary to calculate the expected crank duration, the voltage $V=(V_{ISG}-V_{offset})$ has to be determined using a two dimensional look up table that references crank duration against both voltage and temperature. In all other respects the system and the method used by the supercapacitor controller 20 to adjust the charging voltage $V_{charge}$ are the same as previously described.

Although the invention has so far been described with reference to two embodiments which both use crank duration, it will be appreciated that other methods of compensating for capacitor degradation or ageing could be used as summarised in table 1 below.

TABLE 1

| Additional Methods | Brief Description |
|---|---|
| Maximum voltage drop | Estimate DC side resistance by the voltage drop during cranking |
| Voltage drop over DC cable | Estimate current by DC cable resistance |
| Losses from voltage curve | Estimate resistance based on losses during starting. |
| Estimate RC time constant | Estimate time constant RC from voltage measurement. |
| Ageing model | Track voltage and temp over time and estimate Supercapacitor degradation |
| Capacitance estimate | Estimate capacitance based on voltage slope and DCDC/PI current |

Maximum Voltage Drop

Figure 5:
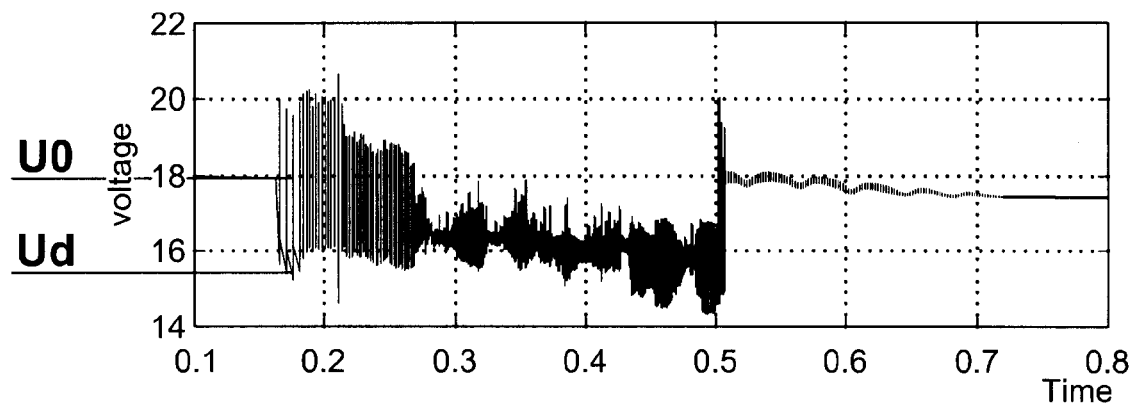
FIG. 5 is a chart showing voltage drop due to rapid increase in discharge current during an engine start.
Figure 10:
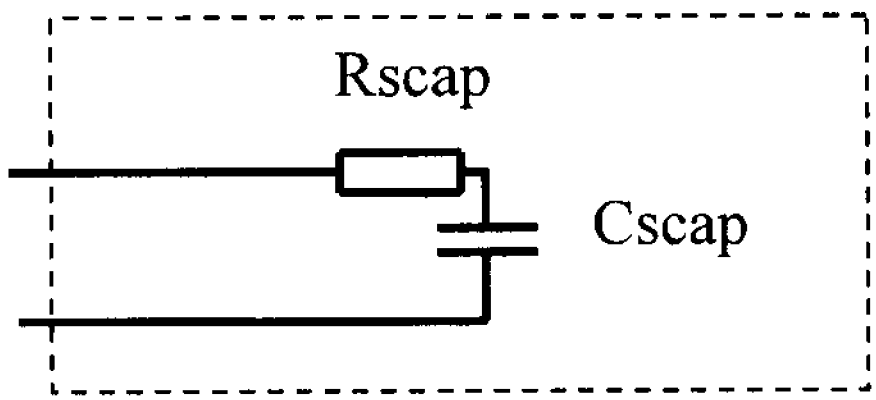
FIG. 10 illustrates an equivalent circuit of the supercapacitor.
Figure 11:
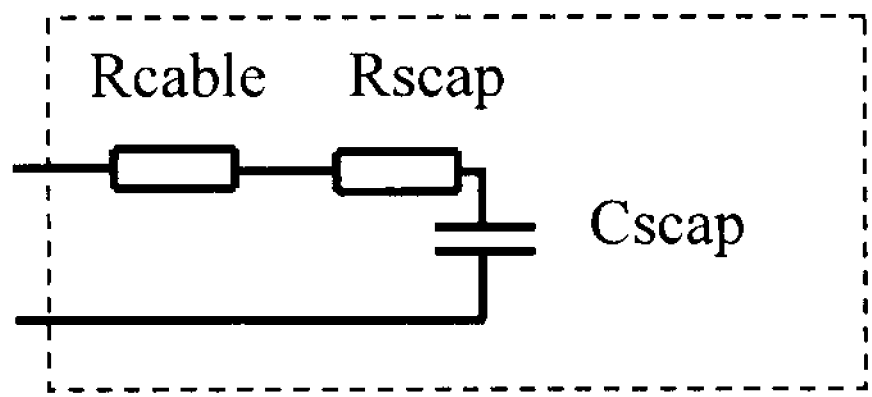
FIG. 11 illustrates a equivalent circuit of the supercapacitor including cable and connector resistances.

The resistance of the supercapacitor (see FIG. 10) or the resistance on the DC side of the power inverter 10 (see FIG. 11; in this case Rcable includes the DC cable resistance as well as the connector resistances) can be estimated by the voltage drop during cranking. This voltage drop can be measured on the supercapacitor terminals (related to FIG. 10) or on the power inverter terminals (related to FIG. 11). The resistance Rdc is calculated using the formula:—

$$Rdc=Ud/(U0-Ud)*Rac,$$

where Ud is the voltage drop at the commencement of cranking and U0 is the initial pack voltage as indicated on FIG. 5 and Rac is the resistance on the AC side of the power inverter (including the resistances of integrated starter generator, the three phase AC cable 7, any connectors and the power inverter 10, and, in case of FIG. 10, the DC cable). If Rdc includes the cable and connector resistances (according to FIG. 11) then the supercapacitor voltage Rscap (according to FIG. 10) is defined by Rdc minus cable and connector resistances.

The change in Rdc can be used by the controller 20 to adjust the voltage supplied by the inverter 10 to the supercapacitor pack 12 in order to charge it thereby compensating for the ageing effect on the supercapacitor pack 12. That is to say a method similar to that shown in FIG. 3 can be used. As such, step 110 is replaced by 'read R-stored'; step 140 and 150 are replaced by 'calculate supercapacitor resistance Rdc'; step 155 is replaced by 'Rdc>R-stored'; step 157 is replaced by 'Decrement R-stored by R_step'; step 156 is replaced by 'Increment R-stored by R_step'; step 180 by 'store updated R-stored'; step 190 by 'read R stored'. The system parameters are adjusted based on R-stored, for instance according to FIG. 12, 13, or 14). The initial value of R-stored should be the expected resistance value of new components.

On the other hand, the estimated resistance value Rdc at step 140 can be directly used to change the system parameters (e.g. as in FIG. 12, 13, or 14), or a low-pass filtered Rdc value could be used.

Figure 13:
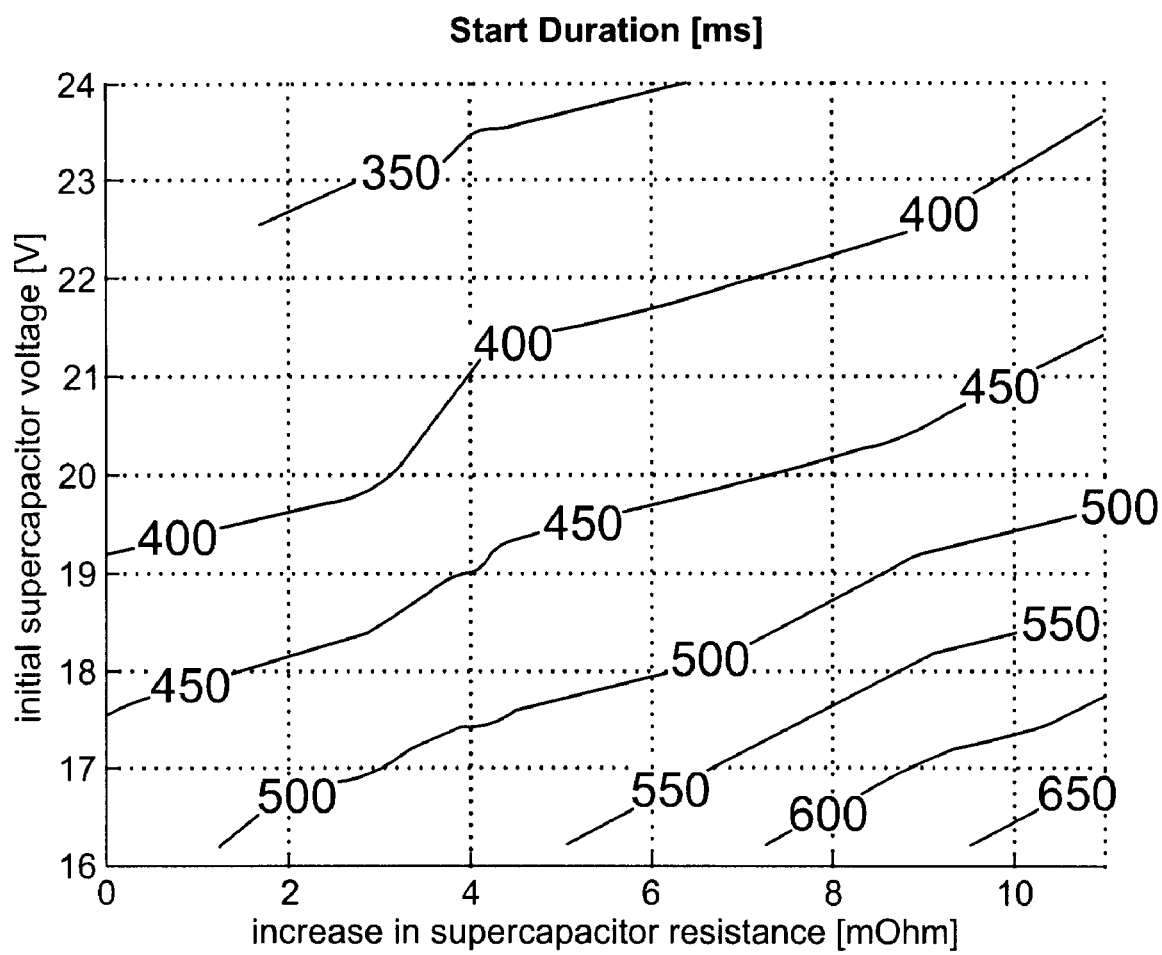
FIG. 13 is a chart showing the time to reach 700 rpm for an engine start as a function of supercapacitor voltage and additional capacitor resistance.
Figure 14:
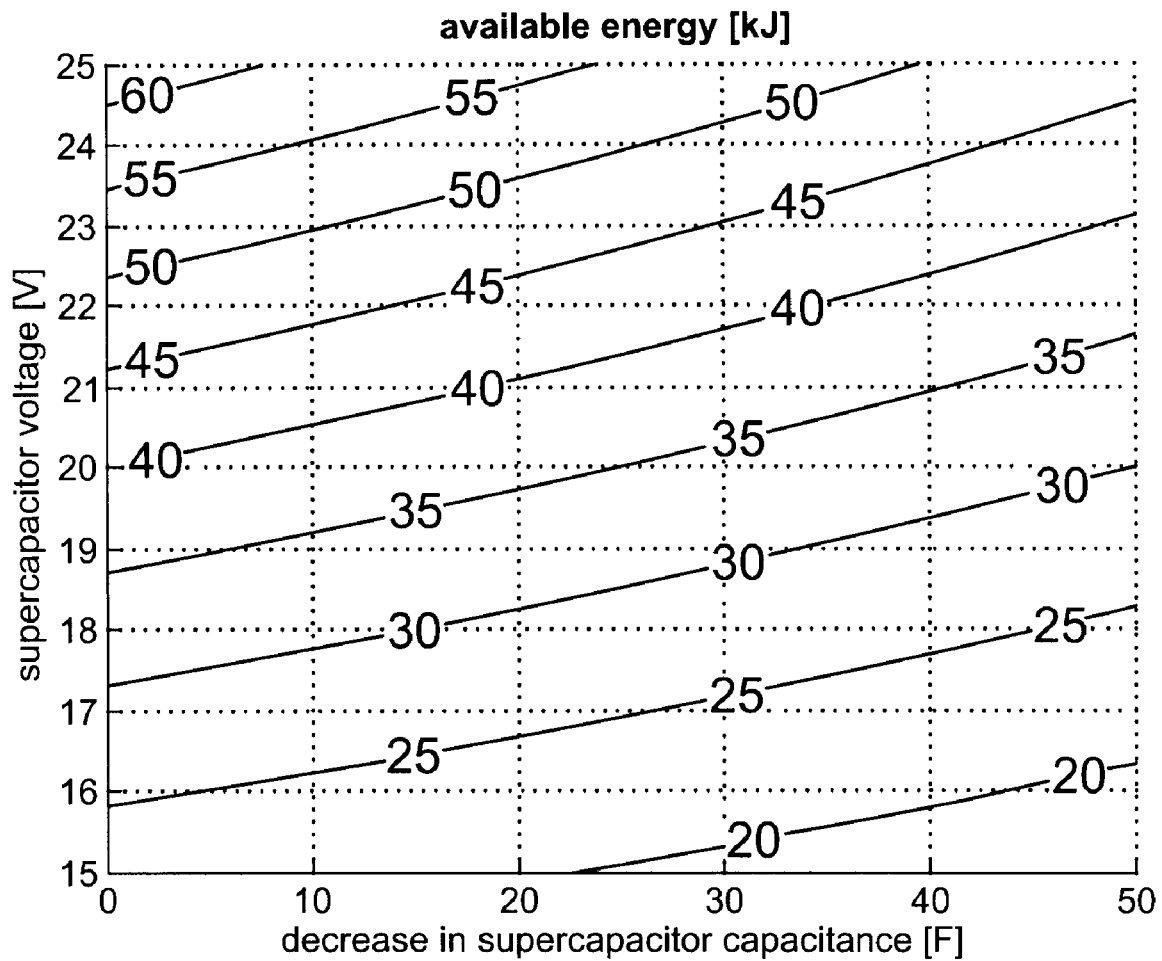
FIG. 14 is a chart showing the available supercapacitor energy as a function of package voltage and decrease in capacitance.

It has to be said that the map in FIG. 13 together with the crank duration and the initial supercapacitor voltage could be used to measure an increased resistance value. As such this value can be used in an similar algorithm.

Voltage Drop Over DC Cable

This method estimates the DC current by the voltage drop over the DC cable. The high currents required for cranking the engine will lead to a measurable voltage drop. The method evaluates a measurement trace instead of a single voltage drop. This yields improved robustness. The current can be determined from the equation $$I=(U\_PI-Uscap)/Rcab$$

where I=the current, U_PI is the supercapacitor voltage on the power inverter side, Uscap is the sensed supercapacitor voltage or the DC supercapacitor voltage and Rcab is the resistance of the cables.

The calculated current I can then be used together with the measured supercapacitor voltage U to estimate the internal resistance of the supercapacitor pack 12. The resistance R is simply calculated by R=U/I. Another method is to measured the current directly by a shunt or hall sensor.

As before, the charging voltage can then be adjusted by the supercapacitor controller 20 based upon any changes of estimated supercapacitor resistance to compensate for supercapacitor ageing. The estimated resistance value can be used as explained above.

Losses from Voltage Curve

Figure 6:
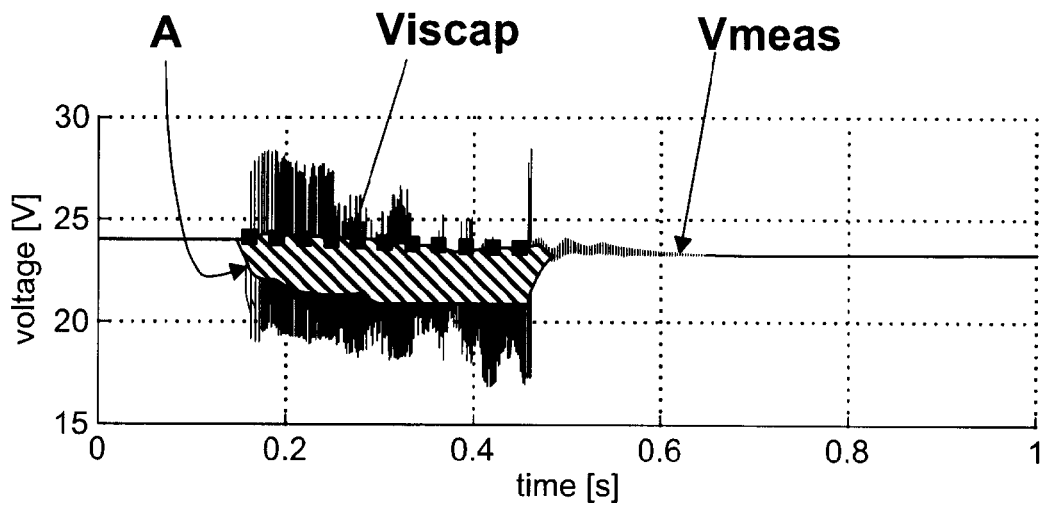
FIG. 6 is a chart showing supercapacitor open circuit voltage and filtered supercapacitor terminal voltage during an engine start.

FIG. 6 illustrates an area "A" which corresponds to the internal capacitor losses. The dotted line Viscap corresponds to the internal state of the super capacitor pack 12 and the continuous line is a measured filtered terminal voltage such as that supplied via the sensor line 22 to the controller 20. Viscap can be estimated for instance by the described 'Estimate RC time constant' method (see below; Viscap equals Vi). The square of the voltage delta between the dotted and continuous lines is integrated over time and this value equals the product of losses and internal resistance measured in [V^2s] or [JOhm]).

Figure 7:
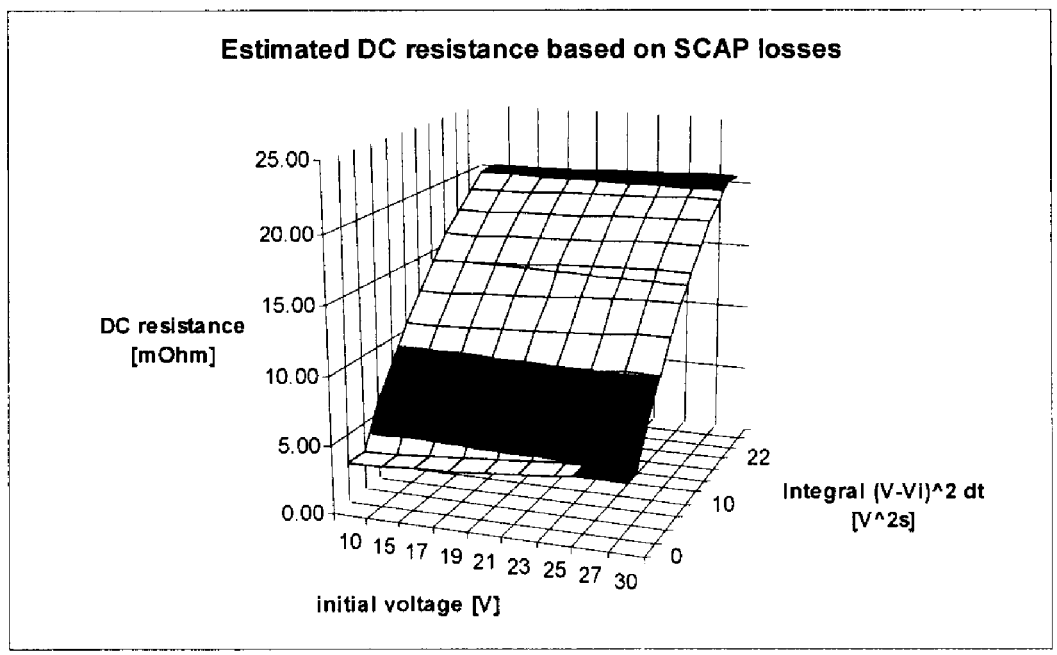
FIG. 7 shows a relationship between initial supercapacitor voltage, internal resistance and the time integral of the square of the difference between supercapacitor open circuit voltage and filtered supercapacitor terminal voltage.

FIG. 7 shows the relationship between initial capacitor voltage, resistance on the DC side of the power inverter 10 and the voltage squared over time area from which an estimate of the resistance value for the supercapacitor pack 12 can be obtained. As before, the charging voltage can then be adjusted based upon any changes of estimated supercapacitor resistance to compensate for supercapacitor ageing. The initial voltage has only a limited effect on the area "A" because the longer start duration offsets a decreasing crank current at lower voltages. The estimated resistance value can be used as explained above.

Estimate RC Time Constant

Resistance and capacitance cannot be estimated by voltage measurements without further information about the current. It is however possible to estimate the time constant of the supercapacitor pack that is to say the product of capacitance and resistance.

Figure 8:
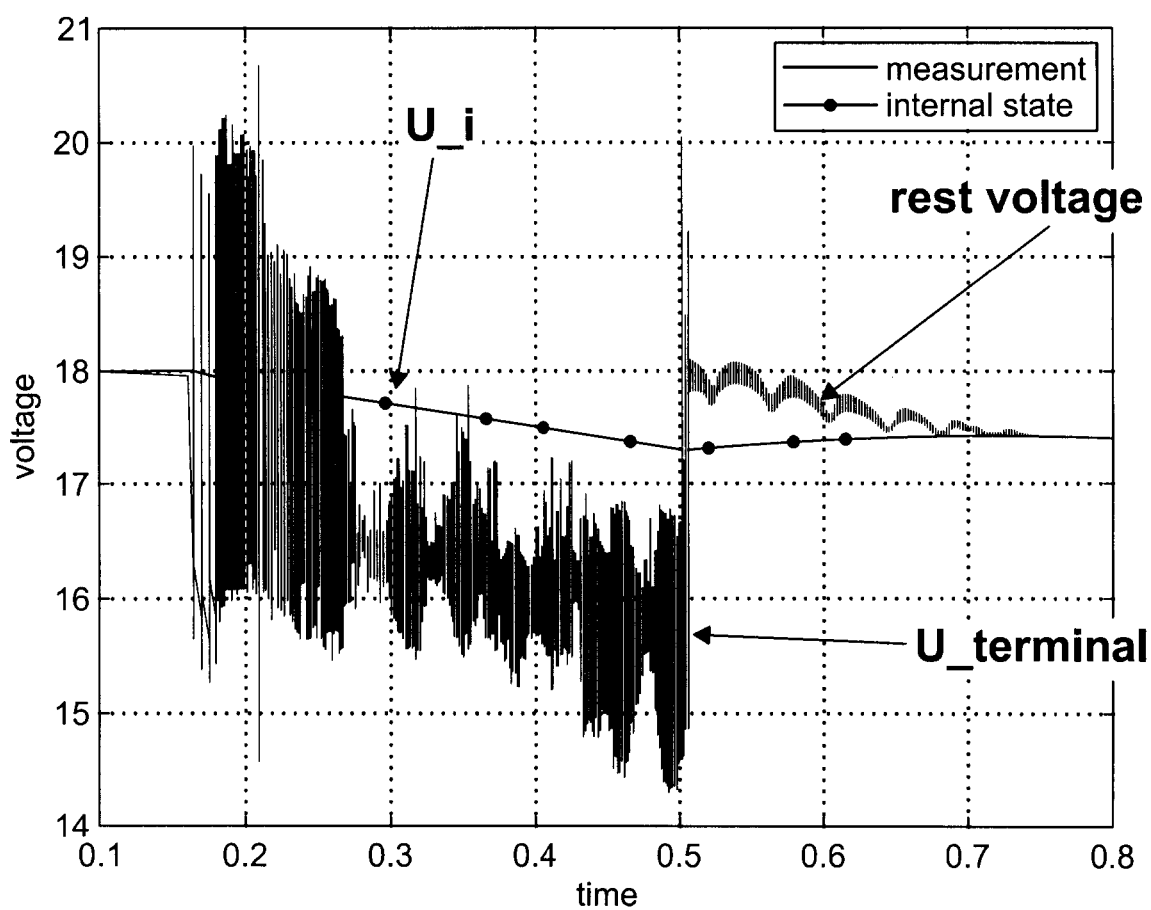
FIG. 8 is a chart showing measured supercapacitor terminal voltage and supercapacitor open circuit voltage during a start, showing the change in supercapacitor open circuit voltage before and after the start.

FIG. 8 shows the terminal voltage and the internal capacitor voltage during an engine start.

The internal capacitor voltage can be described by the differential equation $$dU\_i/dt=1/R/C*(U\_\text{terminal}-U\_i).$$

with U_i being the internal or open circuit voltage of the capacitor, U_terminal the voltage measured at the terminals of the capacitor, R the internal resistance of the capacitor, and C the capacity of the capacitor.

If the capacitor current is zero at beginning and end of one crank event (or any other arbitrary charging or discharging event), then initial and rest voltage can be used as boundary conditions for the internal capacitor voltage. The product RC can be adapted accordingly.

Advantages of this method are that it is a pure electrical evaluation of the super capacitor behaviour with no influence of mechanical changes, it provides an estimator for the internal capacitor voltage (this could be used for the losses from voltage curve method) and it could be used together with an additional resistance or capacitance estimator. Disadvantages of this method are that it cannot separate between an increase in resistance or a decrease in capacitance because the effects are mixed up, there is only a small change over lifetime and the capacitor current must be zero at the beginning and the end of a crank event.

Nevertheless, the time constant RC can be used as before by the supercapacitor controller 20 to adjust the charging voltage based upon any changes of RC to compensate for supercapacitor ageing. If, for example, the RC has increased then the charging voltage can also be increased by a proportionate amount either linearly or in accordance with some non-linear relationship stored in a look up table.

This approach can be combined with one of the other methods. If the other method provides an indication for R, and this method provides the product RC, one can calculate C=RC/R. If the other method provides an indication for C, and this method provides the product RC, one can calculate R=RC/C.

Aging Model

The paper 'Temperature behavior and impedance fundamentals of supercapacitors', Journal of Power Sources 154 (2006) pp. 550-555, describes the ageing of supercapacitors. The voltage level as well as the cell temperature define the speed of degradation. In fact, the decrease in capacitance and increase in resistance can be characterised by the Arrhenius law. Therefore the measured capacitor voltage and temperature can be used to directly estimate the degradation of the device. A drawback is that a weak-up of the power inverter is required for a reliable prediction of the capacitor degradation during key-off and continuous measurements of capacitor voltage and temperature are required.

Nevertheless, by programming such an equation into the supercapacitor controller 20 it is possible to estimate degradation of the supercapacitor pack 12. The system parameters of the starter system can then be adjusted according to the predicted resistance and capacitance values (for instance according to FIGS. 12, 13, and 14) and thereby compensating for the ageing or degradation of the supercapacitor pack 12.

Capacitance Estimate

The capacitance value of the supercapacitor pack 12 can be estimated during a charge or discharge phase. From integration of the current i over time t and voltage before and after charge or discharge phase, V_1 and V_2 respectively, the capacity of the supercapacitor may be calculated. The capacitance is C=integral(i*dt)/(V_2−V_1).

If the capacity goes down, voltage needs to be increased to maintain energy stored (see FIG. 14).

Figure 9:
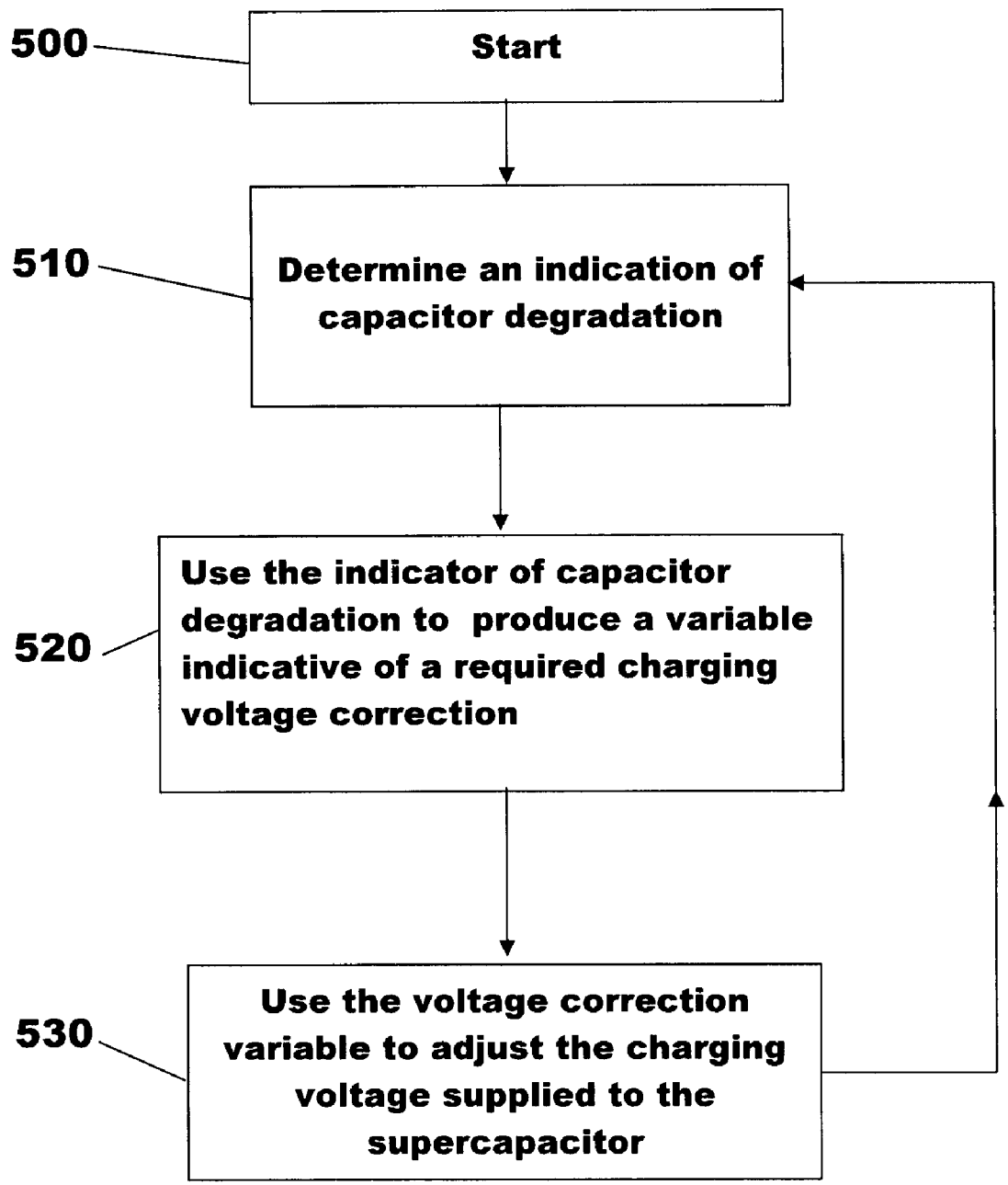
FIG. 9 shows a generic method according to the invention.

FIG. 9 shows a generalised method according to the invention for adjusting a parameter of the starter system to compensate for capacitor degradation/ageing.

The method starts at step 500 which is a key-on event and then progresses to step 510 where an indication of capacitor degradation is obtained using one of the methods described above. The method then advances to step 520 where this indication is converted by calculation or by using a look-up table into a voltage correction required to compensate for the degradation and then in step 530 this voltage correction is applied in this case to the voltage output from the inverter 10 so that the supercapacitor pack 12 is charged to a slightly higher voltage than on the last recharge cycle so as to compensate for the loss of supercapacitor pack performance. It will be appreciated that the charging voltage may not be incremented after every engine start but only when the loss of performance has reached a predetermined level.

Therefore, in summary, a number of methods for determining a state of health of the supercapacitor pack are possible and all of these could then be used to provide an indications of the degradation or ageing of the supercapacitor pack which can then be compensated for by increasing/decreasing the voltage to which the supercapacitor pack is recharged by the inverter 10.

Although the invention has so far been described by way of example to embodiments in which degradation of the supercapacitor pack is compensated for by adjusting a parameter of the starter system in the form of the voltage used to recharge the supercapacitor, it will be appreciated that other parameters of the starter system could be adjusted or adjusting starter system parameters could comprise adjusting at least one starter system parameter based upon a measured capacitor current measured for instance by a shunt or a hall sensor.

In order for the integrated starter generator to function correctly and in order to assure a reliable estimation of the minimum/maximum allowed voltage levels during stop/start, one or more of the following requirements must be met:

1/a trigger signal is required to signal a start prior to actual integrated starter generator rotor excitation;
2/the DCDC current on the 24V side at the beginning of the start should be low enough such that the corresponding voltage drop does not disturb the measurements (at least most of the restarts);
3/the DCDC converter is to disabled immediately a start commences;
5/automatic restarts of the engine are only expected at engine temperatures high enough such that the engine friction is as expected and with a capacitor pack temperature at temperatures for which an assumed temperature independence is feasible or at temperatures for which a compensation by a map is possible;
6/ideally there should be no belt slip during cranking or a start with belt slip could be ignored; and
7/the vehicle clutch should be 100% pressed (disengaged) during the start or the start could be ignored.

It will be appreciated by those skilled in the art that although the invention has been described by way of example with reference to one or more embodiments it is not limited to the disclosed embodiments and that one or more modifications to the disclosed embodiments or alternative embodiments could be constructed without departing from the scope of the invention.

For example, the invention is not limited to the voltage levels disclosed herein and other voltage levels could be used without departing from the scope of the invention.

The invention claimed is:

1. A micro-hybrid motor vehicle having an internal combustion engine and an engine starter system for starting the engine wherein the engine starter system comprises an electrical starter to start the engine, a capacitor to supply electrical energy to the starter to start the engine, a generator to supply electrical energy to the capacitor to recharge the capacitor and a controller to adjust starter system parameters, wherein the controller is operable to adjust starter system parameters based upon monitored capacitor degradation including adjusting the voltage to which the capacitor is charged based upon a comparison of a start duration with a predicted start duration.

2. A micro-hybrid motor vehicle as claimed in claim 1, wherein the system further comprises a voltage sensor to measure the voltage of the capacitor and the controller uses the measured voltage to calculate the predicted start duration.

3. A micro-hybrid motor vehicle as claimed in claim 2, wherein the predicted start duration is determined using a look up table relating time to reach the predetermined cranking speed and voltage.

4. A micro-hybrid motor vehicle as claimed in claim 1, wherein the system further comprises a voltage sensor to measure the voltage of the capacitor, a temperature sensor to measure the temperature of the capacitor, and the controller uses the measured voltage and the measured temperature to calculate the predicted start duration.

5. A micro-hybrid motor vehicle as claimed in claim 4, wherein the predicted start duration is determined using a three dimensional look up table relating expected start duration, temperature and voltage.

6. A micro-hybrid motor vehicle as claimed in claim 1, wherein the voltage is increased by a predetermined amount if the measured start duration is greater than the expected start duration.

7. A micro-hybrid motor vehicle as claimed in claim 1, wherein the voltage is decreased by a predetermined amount if the measured start duration is less than the expected start duration.

8. A micro-hybrid motor vehicle as claimed in claim 1, wherein the engine starter and the generator are formed as a single integrated starter-generator.

9. A micro-hybrid motor vehicle as claimed in claim 8 in which the integrated starter-generator is a multi-phase device and micro-hybrid motor vehicle further comprises an inverter having a DC side connected to the capacitor and a multi-phase side connected to the integrated starter-generator wherein the controller is operable to adjust the starter system parameters by adjusting the DC voltage supplied to the capacitor from the inverter to recharge the capacitor.

10. A micro-hybrid motor vehicle as claimed in claim 1, wherein adjusting starter system parameters comprises adjusting at least one starter system parameter based upon a determination of an estimate of capacitor degradation obtained from a measurement of maximum voltage drop during cranking of the engine.

11. A micro-hybrid motor vehicle as claimed in claim 1, wherein adjusting starter system parameters comprises adjusting at least one starter system parameter based upon a determination of the voltage drop in a DC cable connecting the capacitor to the starter motor.

12. A micro-hybrid motor vehicle as claimed in claim 1, wherein adjusting starter system parameters comprises adjusting at least one starter system parameter based upon a measured capacitor current.

13. A micro-hybrid motor vehicle as claimed in claim 1, wherein adjusting starter system parameters comprises adjusting at least one starter system parameter based upon a determination of losses from a voltage curve generated from measurements taken during cranking of the engine.

14. A micro-hybrid motor vehicle as claimed in claim 1, wherein adjusting starter system parameters comprises adjusting at least one starter system parameter based upon a determination of a time constant produced from voltage measurements taken during cranking of the engine.

15. A micro-hybrid motor vehicle as claimed in claim 1, wherein adjusting starter system parameters comprises adjusting at least one starter system parameter based upon a determination of a prediction of capacitor ageing.

16. A micro-hybrid motor vehicle as claimed in claim 1, wherein adjusting starter system parameters comprises adjusting at least one starter system parameter based upon an estimate of capacitor capacitance obtained using a voltage slope generated from measurements taken during cranking of the engine.

17. A micro-hybrid motor vehicle as claimed in claim 1, wherein the capacitor is a supercapacitor pack having a number of supercapacitors joined together in series.

18. A method of controlling operation of an internal combustion engine starter system using a capacitor as an electrical energy source for starting the internal combustion engine, the method comprising monitoring capacitor performance during starting of the engine and adjusting one or more starter system parameters to compensate for capacitor degradation including measuring a start duration, predicting a start duration from one or more measured parameters, comparing the measured start duration with the predicted start duration and adjusting the voltage supplied to the capacitor to recharge the capacitor based upon the comparison.

19. A method as claimed in claim 18, wherein the method further comprises measuring a voltage of the capacitor prior to starting and the predicted start duration is based upon the measured voltage.

20. A method as claimed in claim 18, wherein the method further comprises measuring a voltage of the capacitor prior to starting, measuring the temperature of the capacitor prior to starting and the predicted start duration is based upon the measured voltage and the measured temperature.

21. A method as claimed in claim 18, wherein the method further comprises increasing the voltage supplied to the capacitor to increase its charge if the measured start duration is greater than the predicted start duration.

22. A method as claimed in claim 18, wherein the method further comprises decreasing the voltage supplied to the capacitor to reduce its charge if the measured start duration is less than the predicted start duration.

23. A method as claimed in claim 18, wherein the method comprises determining an indication of capacitor degradation from the monitored capacitor performance during starting of the engine, using the indicator to produce a variable indicative of a required charging voltage correction and adjusting one or more starter system parameters by adjusting the charging voltage based upon the variable to compensate for capacitor degradation.

* * * * *